(12) United States Patent
Zhai

(10) Patent No.: US 10,770,485 B2
(45) Date of Patent: Sep. 8, 2020

(54) ARRAY SUBSTRATE, DISPLAY PANELS AND DISPLAY DEVICES

(71) Applicant: Shanghai Tianma Micro-Electronics Co., Ltd., Shanghai (CN)

(72) Inventor: Yingteng Zhai, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 16/566,361

(22) Filed: Sep. 10, 2019

(65) Prior Publication Data

US 2020/0176487 A1 Jun. 4, 2020

(30) Foreign Application Priority Data

Nov. 29, 2018 (CN) .......................... 2018 1 1446829

(51) Int. Cl.
*G02F 1/1362* (2006.01)
*G02F 1/1333* (2006.01)
(Continued)

(52) U.S. Cl.
CPC ........ *H01L 27/1244* (2013.01); *G02F 1/1368* (2013.01); *G02F 1/133345* (2013.01); *G02F 1/136204* (2013.01); *G02F 1/136286* (2013.01); *H01L 27/0292* (2013.01); *H01L 27/1259* (2013.01); *G02F 2001/136295* (2013.01)

(58) Field of Classification Search
CPC ........ G02F 1/136204; G02F 1/136286; G02F 1/1368; G02F 2202/16; G02F 2202/22; G02F 2001/136295; H01L 27/0292; H01L 27/124; H01L 27/1259; H01L 27/0248; H01L 27/1244; H01L 23/60;
(Continued)

(56) References Cited

U.S. PATENT DOCUMENTS

2009/0310052 A1* 12/2009 Huang ................ G02F 1/13452
349/40
2014/0071384 A1* 3/2014 Ho .................... G02F 1/136204
349/106

FOREIGN PATENT DOCUMENTS

CN          104900589 A       9/2015

* cited by examiner

*Primary Examiner* — Thoi V Duong
(74) *Attorney, Agent, or Firm* — Miller Matthias & Hull LLP

(57) ABSTRACT

Provided are an array substrate, display panels and display devices. The array substrate includes: a base substrate; an insulating layer located on one side of the substrate and including at least one plateau-shaped protrusion, where the plateau-shaped protrusion includes a first surface and a second surface, wherein the first surface and the second surface are arranged opposite to each other along a direction perpendicular to the base substrate, the first surface is located at a side of the second surface opposite to the base substrate, and an area of the first surface is less than an area of the second surface in a direction perpendicular to the base substrate; and an electrostatic conductive layer located on a side of the insulating layer away from the substrate, where the electrostatic conductive layer includes a first wire and at least one first discharge tip electrically connected to the first wire, the first discharge tip is located on a side slope of the plateau-shaped protrusion and is located in a non-display area. The electrostatic conductive layer further includes an auxiliary discharge structure disposed opposite to the first discharge tip.

17 Claims, 11 Drawing Sheets

(51) Int. Cl.
*H01L 27/12* (2006.01)
*G02F 1/1368* (2006.01)
*H01L 27/02* (2006.01)

(58) Field of Classification Search
CPC .... G09G 2330/04; H05K 1/0259; H05F 3/04; G09F 9/30
See application file for complete search history.

ARRAY SUBSTRATE, DISPLAY PANELS AND DISPLAY DEVICES

CROSS-REFERENCE TO RELATED APPLICATIONS

This application claims priority to Chinese patent application No. 201811446829.9 filed with the Patent Office of the People's Republic of China on Nov. 29, 2018, the disclosure of which is incorporated herein by reference in its entirety.

TECHNICAL FIELD

The present disclosure relates to display technology and, in particular, to an array substrate, display panels and display devices.

BACKGROUND

With the development of display technology, more and more display devices are applied to people's daily life and work, bringing great convenience to people's daily life and work. Static electricity exists everywhere in daily life and work. During the use of display devices, electrostatic discharge (ESD) is a necessary means to avoid display device failure.

Usually, the ESD can be implemented via point discharge. However, the discharge voltage of the existing point discharge structure is relatively high, so that the static electricity can be released through other ways before the point discharge, thereby causing display abnormality of the display panel and display device.

SUMMARY

The present disclosure provides an array substrate, display panels and display devices to provide a sharper discharge tip.

In a first aspect, the present disclosure provides an array substrate. The array substrate includes a base substrate, an insulating layer and an electrostatic conductive layer.

The substrate includes a display area and a non-display area surrounding the display area.

The insulating layer is located on a side of the base substrate. The insulating layer includes at least one plateau-shaped protrusion. The plateau-shaped protrusion includes a first surface and a second surface, which are arranged opposite to each other along a direction perpendicular to the base substrate. The first surface is located at a side of the second surface opposite to the base substrate, and an area of the first surface is less than an area of the second surface.

The electrostatic conductive layer is located on a side of the insulating layer away from the base substrate. The electrostatic conductive layer includes a first wire and at least one first discharge tip, the first wire is electrically connected to the first discharge tip, the first discharge tip is located on a side slope of the plateau-shaped protrusion and is located in the non-display area.

The electrostatic conductive layer further includes an auxiliary discharge structure. The auxiliary discharge structure and the first discharge tip are disposed opposite to each other.

In a second aspect, the present disclosure further provides a display panel including an array substrate. The array substrate includes a base substrate, an insulating layer and an electrostatic conductive layer. The substrate includes a display area and a non-display area surrounding the display area. The insulating layer is located on a side of the base substrate. The insulating layer includes at least one plateau-shaped protrusion. The plateau-shaped protrusion includes a first surface and a second surface, which are arranged opposite to each other along a direction perpendicular to the base substrate. The first surface is located at a side of the second surface opposite to the base substrate, and an area of the first surface is less than an area of the second surface. The electrostatic conductive layer is located on a side of the insulating layer away from the base substrate. The electrostatic conductive layer includes a first wire and at least one first discharge tip, the first wire is electrically connected to the first discharge tip, the first discharge tip is located on a side slope of the plateau-shaped protrusion and is located in the non-display area. The electrostatic conductive layer further includes an auxiliary discharge structure. The auxiliary discharge structure and the first discharge tip are disposed opposite to each other.

In a third aspect, the present disclosure further provides a display device including the display panel. The display panel includes an array substrate. The array substrate includes a base substrate, an insulating layer and an electrostatic conductive layer. The substrate includes a display area and a non-display area surrounding the display area. The insulating layer is located on a side of the base substrate. The insulating layer includes at least one plateau-shaped protrusion. The plateau-shaped protrusion includes a first surface and a second surface, which are arranged opposite to each other along a direction perpendicular to the base substrate. The first surface is located at a side of the second surface opposite to the base substrate, and an area of the first surface is less than an area of the second surface. The electrostatic conductive layer is located on a side of the insulating layer away from the base substrate. The electrostatic conductive layer includes a first wire and at least one first discharge tip, the first wire is electrically connected to the first discharge tip, the first discharge tip is located on a side slope of the plateau-shaped protrusion and is located in the non-display area. The electrostatic conductive layer further includes an auxiliary discharge structure. The auxiliary discharge structure and the first discharge tip are disposed opposite to each other.

DETAILED DESCRIPTION

Figure 1:
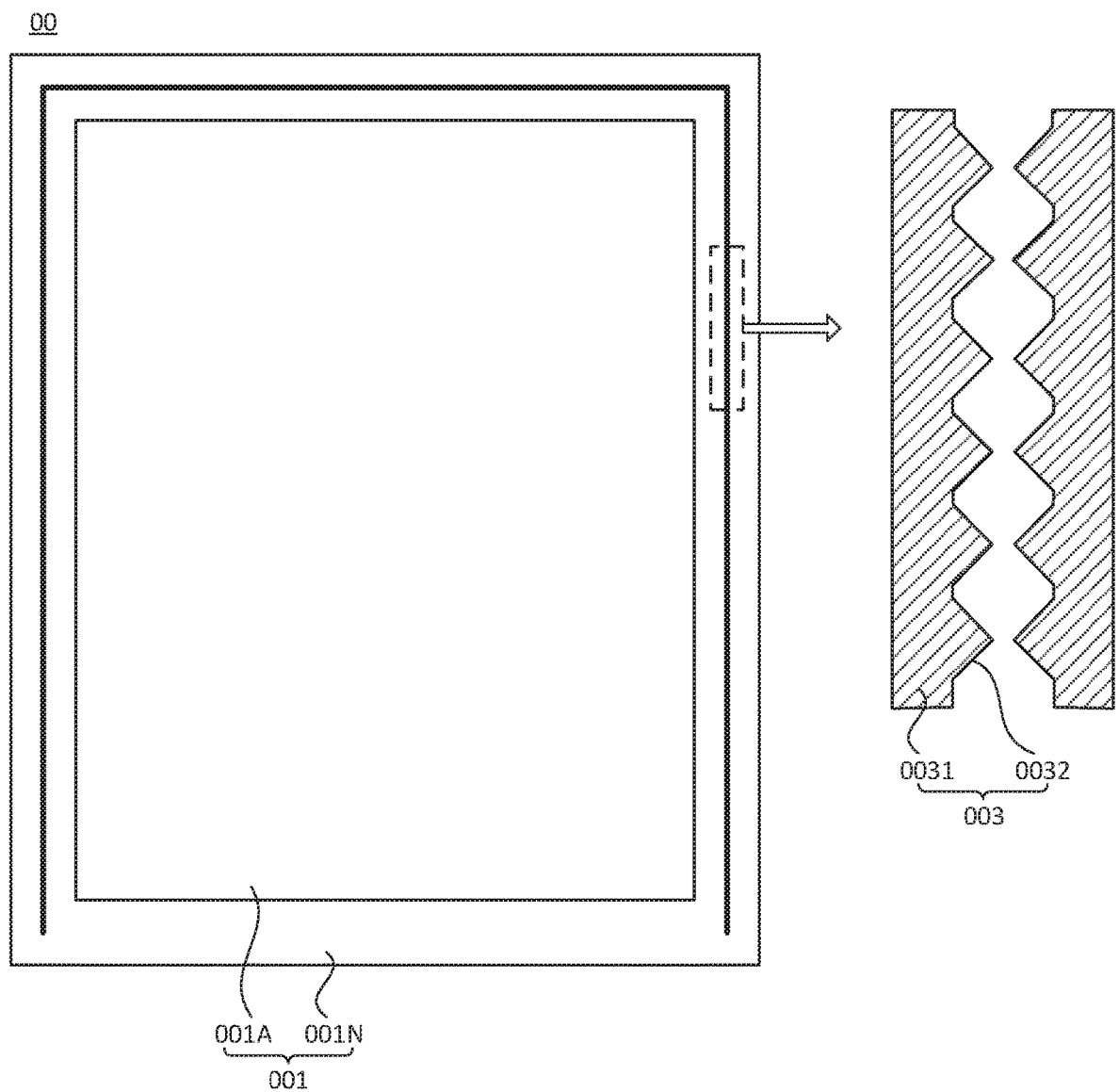
FIG. 1 is a structural diagram of an array substrate in the related art.

Hereinafter the present disclosure will be further described in detail in conjunction with the drawings and embodiments. It should be understood that the specific embodiments set forth below are merely intended to illustrate and not to limit the present disclosure. Additionally, it should be noted that, for ease of description, only part, not all, of the structures related to the present disclosure are illustrated in the drawings.

FIG. 1 is a structural diagram of an array substrate in the related art. Referring to FIG. 1, the array substrate 00 includes a base substrate 001. The base substrate 001 includes a display area 001A and a non-display area 001N. The non-display area 001N is disposed surrounding the display area 001A. An electrostatic discharge structure 003 is further disposed in the non-display area 001N. The electrostatic discharge structure 003 includes two wires disposed opposite to each other. Each wire includes a straight portion 0031 and a discharge tip 0032. The straight portion 0031 is electrically connected to the discharge tip 0032. When a large amount of electrostatic charge is accumulated on one of the wires, the electrostatic charges are released via the discharging between discharge tips disposed opposite to each other of the wire. In this way, the electrostatic energy is consumed, so as to reduce the damage of the static electricity to the array substrate, display panel and display device. However, in the existing electrostatic discharge structure 003, the two wires disposed opposite to each other adopt a plane wire structure, and the discharge tip 0032 is manufactured through a photolithography process. The manufactured discharge tip 0032 thus has a relatively large tip angle (which may be understood as a "blunt tip"), so that the discharge voltage of the discharge tip is high. On this basis, when the electrostatic charges accumulate on the wires and have not reached the discharge voltage of the discharge tip, the electrostatic charges accumulated on the wire may be discharged through other conductive ways, which may cause damage to other lines in the array substrate, thereby causing line damages in the array substrate and display abnormality of the display panel and the display device. Of course, if the display panel also integrates a function of touch control or a function of a pressure sensor, the discharge of electrostatic charges may also cause the display panel and display device to fail in touch control or pressure sensing. Only a display function of the display panel and display device is taken as an example and described below. The function of touch control and the function of pressure sensors of the display panel may be understood with reference to the following description. Details are not described herein.

In view of the above problem, an embodiment of the present disclosure provides an array substrate. A plateau-shaped protrusion is formed on the array substrate and a first discharge tip is formed on a side slope of the plateau-shaped protrusion, so as to form a sharper first discharge tip. Therefore, a discharge voltage of the discharge tip is reduced and the static electricity is easy to be released, thereby helping to avoid line damages in the array substrate caused by the electrostatic charges released through other ways and further avoid the display abnormality of the display panel and the display device.

Figure 2:
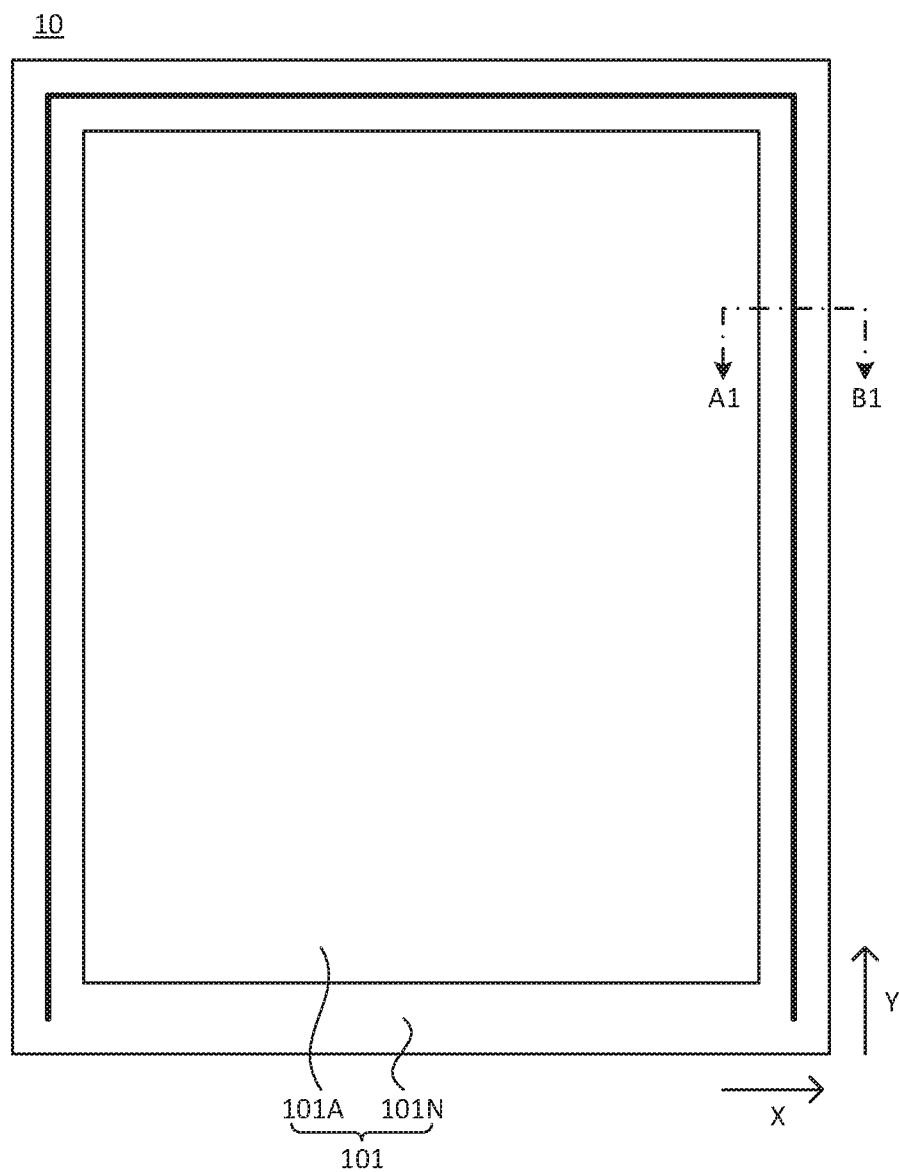
FIG. 2 is a structural diagram of an array substrate according to an embodiment of the present disclosure.
Figure 3:
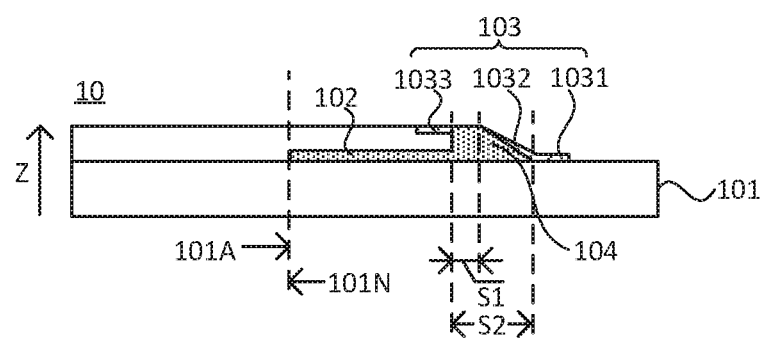
FIG. 3 is a cross-sectional view of an array substrate of FIG. 2 taken along an A1-B1 direction.

Exemplarily, FIG. 2 is a structural diagram of an array substrate according to an embodiment of the present disclosure; and FIG. 3 is a cross-sectional view of an array substrate of FIG. 2 taken along an A1-B1 direction. Referring to FIGS. 2 and 3, the array substrate 10 includes: a base substrate 101, which includes a display area 101A and a non-display area 101N surrounding the display area 101A; an insulating layer 102 located on a side of the base substrate 101, where the insulating layer 102 includes at least one plateau-shaped protrusion 104, where a vertical projection (the vertical projection corresponds to a first length S1) of a surface of the plateau-shaped protrusion 104 away from the base substrate 101 onto the substrate 101 is located within a vertical projection (the vertical projection corresponds to a second length S2) of a surface of the plateau-shaped protrusion 104 facing the substrate 101 onto the base substrate 101; and an electrostatic conductive layer 103 is located on a side of the insulating layer 102 away from the base substrate 101, where the electrostatic conductive layer 103 includes a first wire 1031 and at least one first discharge tip 1032, the first wire 1031 is electrically connected to the first discharge tip 1032, the first discharge tip 1032 is located on a side slope of the plateau-shaped protrusion 104 and is located in the non-display area 101N. The electrostatic conductive layer 103 further includes an auxiliary discharge structure 1033. The auxiliary discharge structure 1033 and the first discharge tip 1032 are disposed opposite to each other. In the present application, when a first conductor and a second conductor are arranged opposite to each other, there is no conductor other than the first and second conductors between the part of the first conductor and the part of the first conductor which face each other.

The base substrate 101 may be a rigid base substrate or a flexible base substrate. The flexibility, also called flexibleness, is a characteristic of an object relative to rigidity; and the flexible base substrate may also be understood as a bendable base substrate. Exemplarily, the material of the flexible base substrate may be an ultra-thin glass, a metal foil or a polymer plastic material. The ultra-thin glass may include an ultra-thin alkali-free glass. The metal foil may include a stainless steel foil, aluminum foil and copper foil, etc. The polymer plastic material may include polyimide (PI), polyvinylalcohol (PVA) and polyethylene terephthalate (PET). The material of the rigid base substrate may be a glass or a silicon wafer. The glass may include an aluminosilicate glass, a soda-lime glass (a white glass) or a green glass. It is to be noted that the above various flexible base substrate materials and various base rigid substrate materials are merely exemplary description and are not intended to limit.

The display area 101A corresponds to a display area of the display panel. The area may include a pixel drive circuit for driving a pixel unit to emit light of different colors, such that the display panel and display device are capable of displaying images to be displayed. The non-display area 101N may be used for arrangement of a wire, which may be used for connecting the pixel drive circuit in the display area 101A to a port for providing a driving signal.

Exemplarily, if the substrate 10 is applied to a light emitting diode display panel, the display area of the array substrate may include a pixel drive circuit and a pixel unit one-to-one electrically connected to the pixel drive circuit. The pixel unit may include a cathode and an anode disposed opposite to each other, and a light emitting layer located between the cathode and the anode. When the pixel drive circuit controls a set voltage difference between the cathode and the anode (or which may be understood as a set current flowing between the cathode and the anode), the light-emitting layer emits a ray with a preset color and a preset intensity. Therefore, by coordinating rays emitted by various pixel units of the whole array substrate, the light emitting diode display panel may display the images to be displayed. Exemplarily, if the array substrate 10 is applied to a liquid crystal display panel, the liquid crystal display panel may include an array substrate and a color filter substrate and a liquid crystal layer located between the array substrate and the color filter substrate. The liquid crystal layer may rotate under the driving of a voltage difference between a pixel electrode and a common electrode to allow a ray with a preset intensity to pass through a filter film with a preset color, so that a corresponding position of the pixel unit may display a ray with the preset color and the preset intensity. Thus, by coordinating rays emitted by various pixel units of the liquid crystal display panel, the liquid crystal display panel may display the images to be displayed. In this structure, the pixel electrode is located on an array substrate side, and the common electrode may be located on the array substrate side or the color filter substrate side, which is not limited in the embodiment of the present disclosure.

It is to be noted that the array substrate 10 may also be applied to other types of display panels known to those skilled in the art, which is not limited in the embodiment of the present disclosure.

The insulating layer 102 is used for forming the plateau-shaped protrusion 104. On one hand, the insulating layer 102 is used for electrical insulation between original conductive film layers in the array substrate 10; on the other hand, the insulating layer 102 may subsequently form the first discharge tip 1032 on the side slope of the plateau-shaped protrusion 104, which facilitates forming a sharper first discharge tip. The material of the insulating layer 102 is described below in detail, and will not be repeated here again.

Exemplarily, an included angle between at least part of the side face of the plateau-shaped protrusion 104 and a plane in which the substrate 101 is located is an acute angle, i.e., the side slope is formed. When the first discharge tip 1032 is formed on the side slope, a climbing process of the electrostatic conductive layer 103 in which the first discharge tip 1032 is located makes the first discharge tip 1032 formed on the side slope get sharpened gradually, thereby manufacturing a relatively sharper first discharge tip 1032.

The electrostatic conductive layer 103 is used for forming the electrostatic discharge structure, which may release the electrostatic charges via the point discharge.

Exemplarily, the electrostatic discharge structure is composed of a first wire 1031, a first discharge tip 1032 and an auxiliary discharge structure 1033. The first wire 1031 is electrically connected to the first discharge tip 1032 for gathering the electrostatic charges at an arrangement position of the first wire 1031 to a tip position of the first discharge tip 1032. When a voltage difference between the first discharge tip 1032 and the auxiliary discharge structure 1033 reaches a discharge voltage because of the gathering of the electrostatic charges in the first discharge tip 1032, the electrostatic charges are released via the point discharge and conducted away by the auxiliary discharge structure 1033 (exemplarily, the electrostatic charges may be conducted to the ground).

The insulating layer 102 includes at least one plateau-shaped protrusion 104, the first discharge tip 1032 is located in the non-display area 101N and is formed on the side slope of the plateau-shaped protrusion 104, so that the first discharge tip 1032 slowly climbs the slope in the formation process, that is, the first discharge tip 1032 gradually becomes sharper on the side slope of the plateau-shaped protrusion 104 along the direction from an end of the side slope adjacent to the substrate 101 to an end of the side slope away from the substrate 101, so that the first discharge tip 1032 is sharper. Since the sharper the discharge tip is, the smaller the discharge voltage of the point discharge is. Therefore, the sharper first discharge tip 1032 may correspond to a smaller discharging voltage, i.e., the sharper first discharge tip 1032 is easier to release the electrostatic charges, thereby helping to avoid line damages in the array substrate 10 caused by releasing the electrostatic charges through other ways before the static electricity in the array substrate 10 is discharged via the tip, and further avoid display abnormality of the display panel and display device.

Firstly, it is to be noted that the electrostatic discharge structure (shown in a bold solid line in FIG. 2) in the electrostatic conductive layer 103 exemplarily showed in FIG. 2 is disposed on three sides of the non-display area 101N surrounding the display area 101A, and is consecutively arranged, but is not intended to limit the array substrate 10 provided by the embodiment of the present disclosure. In other embodiments, a position of the electrostatic discharge structure in the electrostatic conductive layer 103 and whether is consecutively configured both may be configured according to the actual requirements of the array substrate 10, and is not limited in the embodiment of the present disclosure.

Next, it is to be noted that the sectional shape of the plateau-shaped protrusion 104 exemplarily showed in FIG. 3 is a right trapezoid, but is not intended to limit the array substrate 10 provided by the embodiment of the present disclosure. In other embodiments, the shape of the plateau-shaped protrusion 104 (which may be understood as the sectional shape or the stereo shape) may be configured according to the actual requirements of the array substrate 10, and is not limited in the embodiment of the present disclosure.

Figure 4:
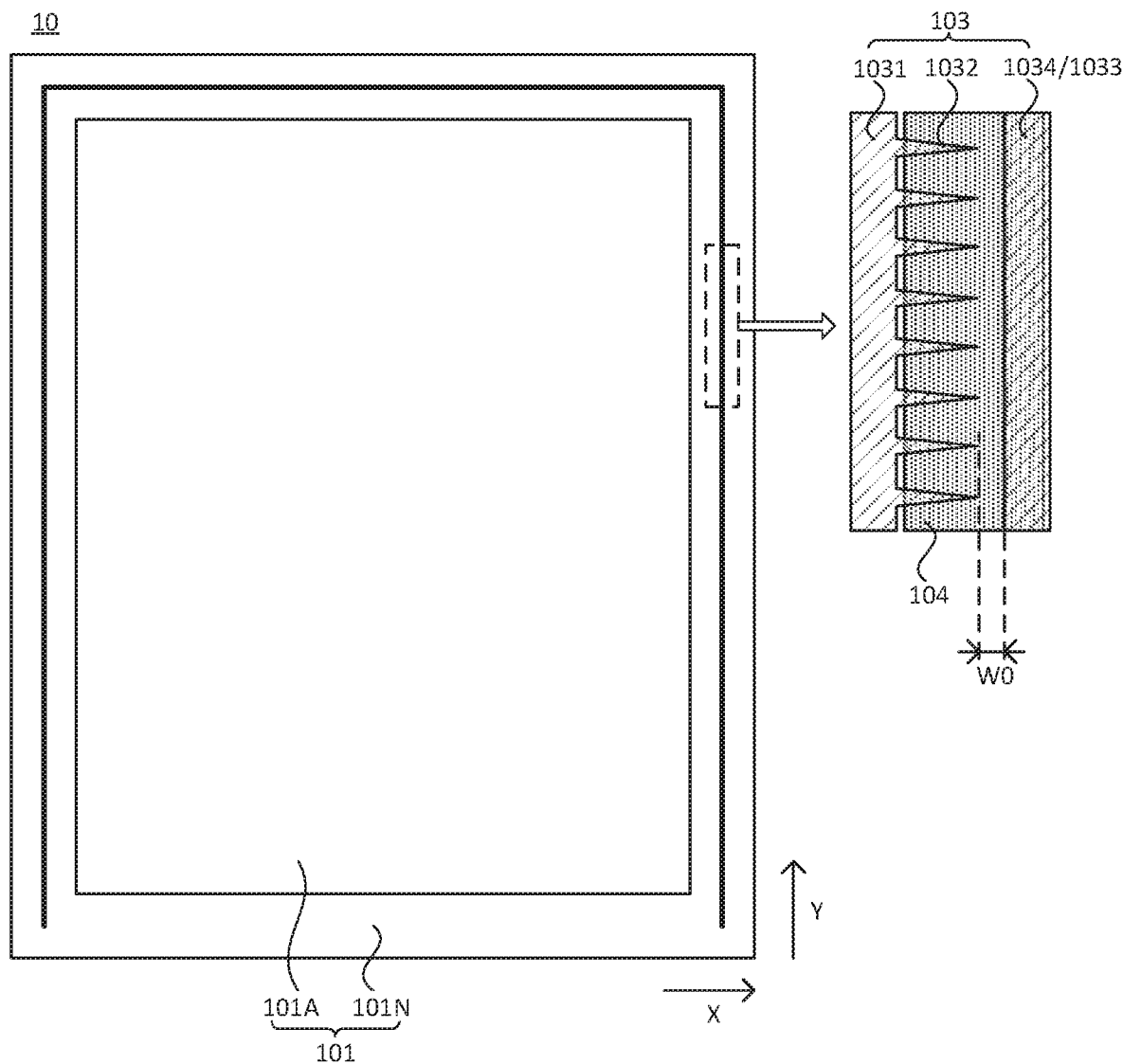
FIG. 4 is a structural diagram of another array substrate according to an embodiment of the present disclosure.

In an embodiment, FIG. 4 is a structural diagram of another array substrate according to an embodiment of the present disclosure. Referring to FIGS. 3 and 4, the electrostatic conductive layer 103 further includes a second wire 1034 located in the non-display area 101N. The second wire 1034 and the first wire 1031 are disposed in parallel. The first discharge tip 1032 and the second wire 1034 are disposed opposite to each other and the second wire 1034 constitutes the auxiliary discharge structure 1033.

Such configuration may conduct the electrostatic charges released by the first discharge tip 1032 by using the second wire 1034. Meanwhile, the use of only one straight wire (i.e., the second wire 1034) as the auxiliary discharge structure 1033 can simplify the difficulty of designing and manufacturing of the auxiliary discharge structure 1033, thereby helping to simplify the overall structure and manufacturing process of the array substrate 10.

Exemplarily, the second wire 1034 may be disposed on a side surface of the plateau-shaped protrusion 104 away from the substrate 101; or the second wire 1034 may be disposed on a side slope opposite to the side slope in which the first discharge tip 1032 is located in the plateau-shaped protrusion 104; or the second wire 1034 may also be disposed on other position opposite to the first discharge tip 1032, which is not limited in the embodiment of the present disclosure.

It is to be noted that the number of the first discharge tips 1032 is only exemplarily shown as eight in FIG. 4, which is only a partial structure of the electrostatic discharge structure in the array substrate 10, and is not intended to limit the array substrate 10 provided by the embodiment of the present disclosure. In other embodiments, the number of the first discharge tips 1032 in the array substrate 10 may be configured according to the actual requirements of the array substrate 10, and is not limited in the embodiment of the present disclosure.

Next, it is to be noted that a tip of the first discharge tip 1032 is disposed away from the display area 101A, which may also be understood that the second wire 1034 is located on a side of the first wire 1031 facing away from the display area 101A. The first discharge tip 1032 is located between the first wire 1031 and the second wire 1032, and is disposed opposite to the second wire 1034, so that the electrostatic charges are in the non-display area 101N and transmitted away from the display area 101A when the first discharge tip 1032 discharges, thereby helping to avoid the discharging abnormality (exemplarily, the second wire 1034 is broken down) that occurs in the discharging process of the first discharge tip 1032 and damages lines of the display area 101A, ensuring the normal display of the screen of the display panel and display device.

In an embodiment, referring to FIG. 4, in a first direction X, a distance W0 between the first discharge tip 1032 and the second wire 1034 is less than a preset distance threshold.

The smaller the distance W0 between the first discharge tip 1032 and the second wire 1034 is, the smaller the discharge voltage of the point discharge of the first discharge tip 1032 is. Exemplarily, the preset distance threshold may be 1 μm, 0.8 μm or 0.5 μm, and the specific value of the present distance threshold may be configured according to the actual requirements of the array substrate 10, which is not limited in the embodiment of the present disclosure.

It is to be noted that to ensure the electrical insulation between the first discharge tip 1032 and the second wire 1034, under the limitation of the process conditions at the current stage, the distance between the first discharge tip 1032 and the second wire 1034 cannot be infinitesimal, i.e., the distance between the two still needs to be greater than a lower limit. A specific value of the lower limit may be configured according to the actual requirements of the array substrate 10 and the actual limitation of the process conditions, and is not limited in the embodiment of the present disclosure.

Figure 5:
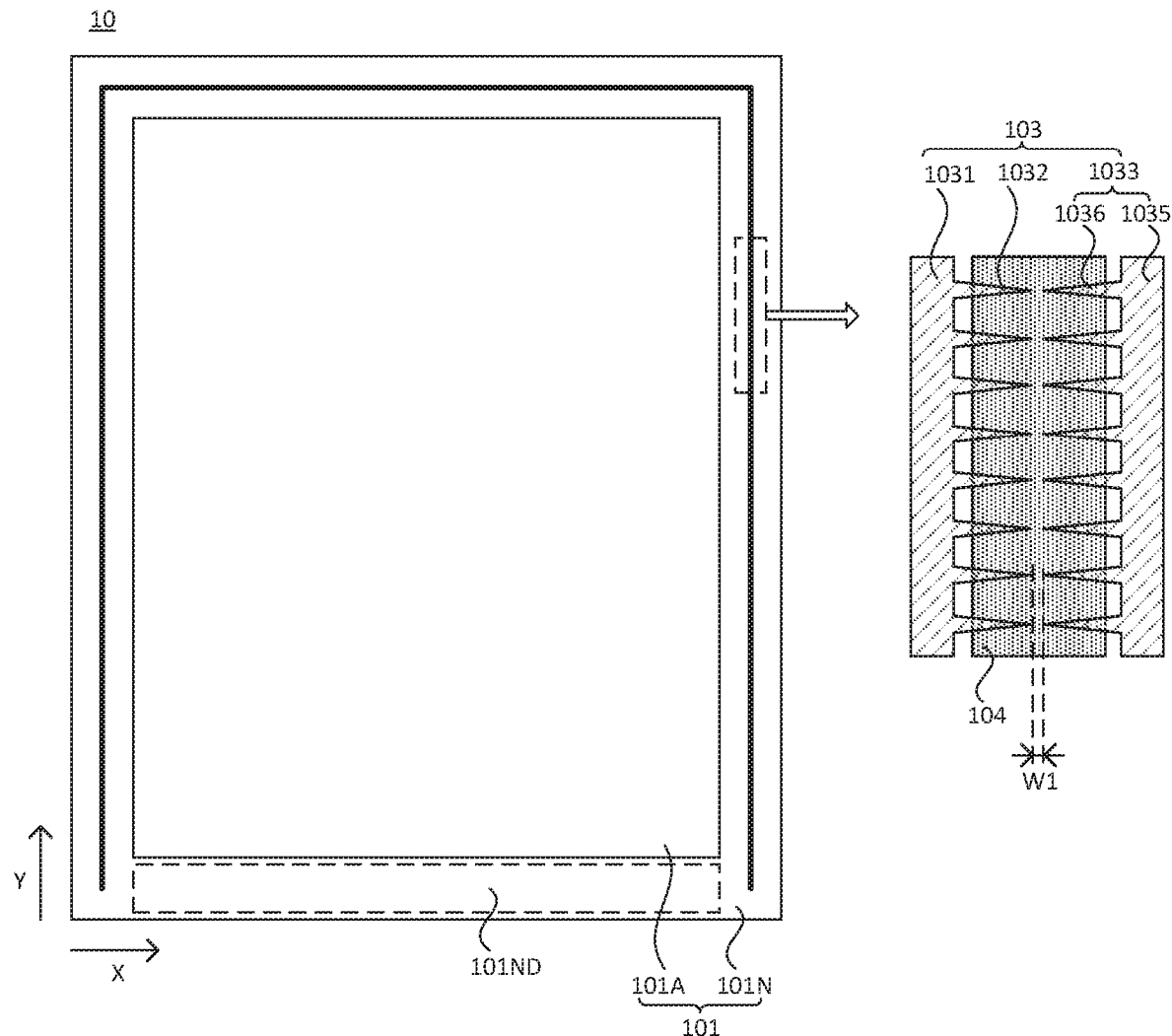
FIG. 5 is a structural diagram of another array substrate according to an embodiment of the present disclosure.
Figure 6:
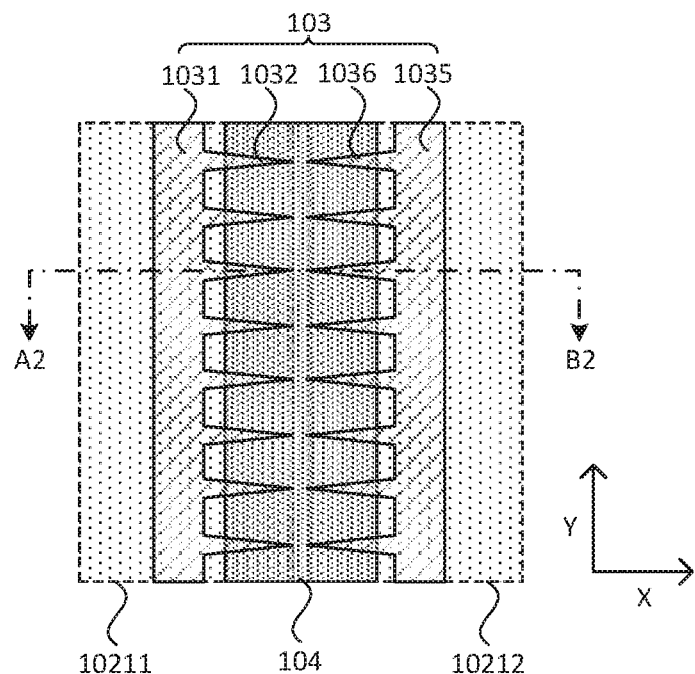
FIG. 6 is a partial enlarged structural diagram of the another array substrate according to an embodiment of the present disclosure.
Figure 7:
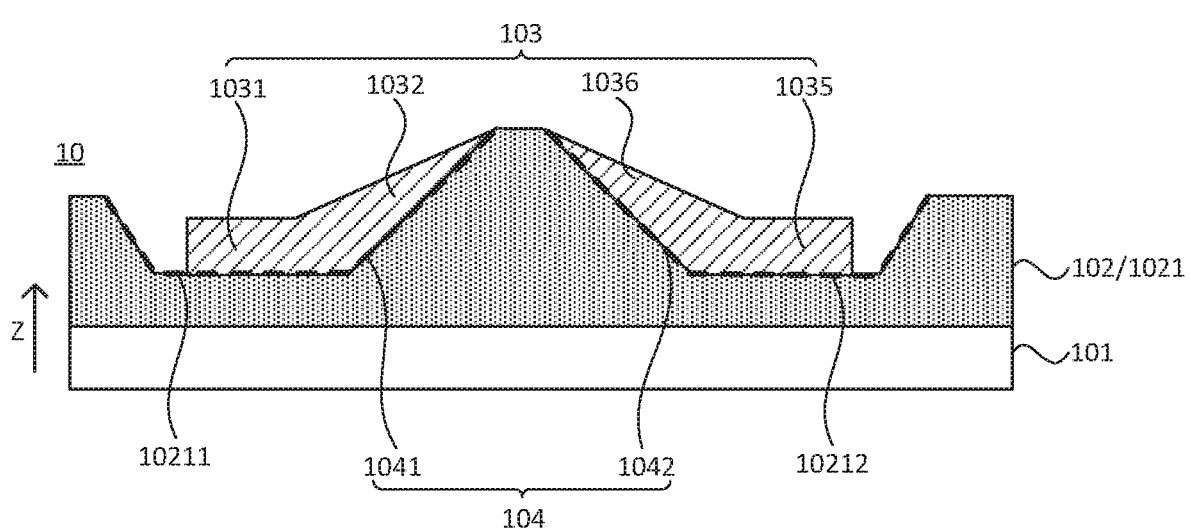
FIG. 7 is a cross-sectional view of an array substrate of FIG. 6 taken along an A2-B2 direction.

In an embodiment, FIG. 5 is a structural diagram of another array substrate according to an embodiment of the present disclosure; FIG. 6 is a partial enlarged structural diagram of the another array substrate according to an embodiment of the present disclosure; and FIG. 7 is a cross-sectional view of an array substrate of FIG. 6 taken along an A2-B2 direction. Referring to FIGS. 5 to 7, the plateau-shaped protrusion 104 includes a first side slope 1041 and a second side slope 1042 which are disposed opposite to each other. The electrostatic conductive layer 103 further includes a third wire 1035 and a third discharge tip 1036. The third discharge tip 1036 is electrically connected to the third wire 1035. The first discharge tip 1032 is disposed on the first side slope 1041, and the third discharge tip 1036 is disposed on a second side slope 1042, the third wire 1035 and the first wire 1031 are disposed in parallel, and the third discharge tip 1036 and the first discharge tip 1032 are disposed opposite to each other. The third wire 1035 and the third discharge tip 1036 constitute the auxiliary discharge structure 1033.

Such configuration may be used for transferring the electrostatic charges gathered in the first discharge tip 1032 to the third wire 1035 by the third discharge tip 1036 and conducting the electrostatic charges away by using the third wire 1035, thus implementing the point discharge process. Meanwhile, the third discharge tip 1036 and the first discharge tip 1032 are disposed opposite to each other. By the tip-to-tip configuration, the discharge voltage of the point discharge may be reduced, so that when the amount of electrostatic charges accumulated in the first discharge tip 1032 is small, the electrostatic charges may be conducted away by using the point discharge, thereby avoiding the line damages in the array substrate caused by releasing the electrostatic charges through other ways. In addition, the third wire 1035 and the first wire 1031 are disposed in parallel, which facilities reducing the area occupied by the electrostatic discharge structure, thereby reducing the area of the non-display area 101N, improving the screen-to-body ratio of the display panel and the display device and implementing narrow frame design after subsequently forming the display panel and the display device.

It is to be noted that only eight pairs of the first discharge tip 1032 and the second discharge tip 1036, which are disposed opposite to each other one-to-one, are exemplarily shown in FIGS. 5 and 6. This is only a partial structure of the electrostatic discharge structure in the array substrate 10, and is not intended to limit the array substrate 10 provided by the embodiment of the present disclosure. In other embodiments, the number of discharge tip pairs of the first discharge tip 1032 and the second discharge tip 1036, which are disposed opposite to each other in the array substrate 10, may be configured according to the actual requirements of the array substrate 10, and is not limited in the embodiment of the present disclosure.

In addition, it is to be noted that the first discharge tip 1032 and the third discharge tip 1036 only exemplarily shown in FIGS. 5 and 6 are configured in pairs, i.e., the number of the first discharge tip 1032 equals to the number of the third discharge tip 1036, but is not intended to limit the embodiment of the present disclosure. In other embodiments, the number of the first discharge tip 1032 and the number of the third discharge tip 1036 may be not equal, i.e., unmated first discharge tip 1032 and the third discharge tip 1036 exist, which is not limited in the embodiment of the present disclosure.

In an embodiment, referring to FIG. 5, a distance W1 between the first discharge tip 1032 and the third wire 1036 is less than a first preset distance threshold.

The smaller the distance W1 between the first discharge tip 1032 and the third wire 1036 is, the smaller the discharge voltage of the point discharge of the first discharge tip 1032 is. Exemplarily, the first preset distance threshold may be 1 μm, 0.8 μm or 0.5 μm, and the specific value of the first present distance threshold may be configured according to the actual requirements of the array substrate 10, which is not limited in the embodiment of the present disclosure.

It is to be noted that to ensure the electrical insulation between the first discharge tip 1032 and the third wire 1036, under the limitation of the process conditions at the current stage, the distance between the first discharge tip 1032 and the third wire 1036 cannot be infinitesimal, i.e., the distance between the two still needs to be greater than a lower limit. A specific value of the lower limit may be configured according to the actual requirements of the array substrate 10 and the actual limitation of the process conditions, and is not limited in the embodiment of the present disclosure.

In an embodiment, referring to FIGS. 6 and 7, the insulating layer 102 includes a first insulating layer 1021. The array substrate 10 further includes a thin film transistor. The first insulating layer 1021 is at least one of a buffer layer, a gate insulating layer, an interlayer insulating layer, an interlayer medium layer, a passivation layer or a first planarization layer in the array substrate. A first groove 10211 and a second groove 10212 disposed opposite to each other are formed on a surface of the first insulating layer 1021 away from the substrate 101. A protrusion structure located between the first groove 10211 and the second groove 10212 (exemplarily, a section outline of the first groove 10211 and the second groove 10212 are shown by a bold dotted line in FIG. 7) is used for forming the plateau-shaped protrusion 104.

The thin film transistor located in the display area 101A may be used for constituting the pixel drive circuit, and the thin film transistor located in the non-display area 101N may be used for constituting a shift register.

Exemplarily, a film layer structure of the array substrate 10 may include: a substrate 101, as well as a buffer layer, an active layer, a gate insulating layer, a gate electrode layer, an interlayer insulating layer, intermediate conductive layer (exemplarily, this layer may be used for forming an electrode of a storage capacitor in the pixel drive circuit), an interlayer medium layer, a source/drain electrode layer, a passivation layer, a planarization layer which are stacked (exemplarily, a stack direction is perpendicular to a third direction Z, the third direction Z is to a plane formed by the first direction X and a second direction Y, i.e., a plane in which the substrate is located) on one side of the substrate.

Usually the buffer layer, the gate insulating layer, the interlayer insulating layer, the interlayer medium layer, the passivation layer and the planarization layer are formed by an insulating material (exemplarily, the insulating material may include an inorganic insulating material such as a silicon nitride, and may also include an organic insulating material). The first insulating layer 1021 may be formed in the same process step with any one or several layers by using the same material. Therefore, the plateau-shaped protrusion 104 in the first insulating layer 1021 may be formed only by modifying mask patterns of the related film layers, thereby simplifying the manufacturing process of the array substrate 10 without increasing the process flow.

By forming the first groove 10211 and the second groove 10212 on the surface of one side of the first insulating layer 1021 away from the substrate 101 and forming the plateau-shaped protrusion 104 by the protrusion structure between the two grooves, the film layer structure of the insulating layer 102 may be simplified, and the number of stacked film layers in the insulating layer 102 may be reduced, thereby increasing the long-term stability of the insulating layer 102, and further improving an overall stability of the array substrate 10.

It is to be noted that the film layer stack structure of the array substrate 10 when the array substrate 10 includes the thin film transistor is only exemplarily shown in the above description, but is not intended to limit the array substrate 10 provided by the embodiment of the present disclosure. In other embodiments, the film layer stack structure may be configured according to the actual requirements of the array substrate 10, the stack mode of the film layers for the thin film transistor may be any mode known to those skilled in the art, which is not limited in the embodiment of the present disclosure.

It should be noted that FIG. 7 only exemplarily illustrates that in the third direction Z, the height of the plateau-shaped protrusion 104 is greater than the height of the first insulating layer 1021 of each of the first groove 10211 and the second groove 10212 at a side away from the plateau-shaped protrusion 104, but is not to limit the display panel 10 according to the embodiments of the present disclosure. In other embodiments, the height relationship between the two may be configured according to the actual requirements of the array substrate 10, which is not limited in the embodiment of the present disclosure.

In an embodiment, referring to FIG. 6, the first groove 10211 and the second groove 10212 each is a bar-shaped groove.

Such configuration may make the shape of the first groove 10211 and the second groove 10212 simple, thereby reducing the difficulty of designing and manufacturing process of the first groove 10211 and the second groove 10212. Meanwhile, the first groove 10211 and the second groove 10212 are bar-shaped grooves, which is convenient to implement the straight and parallel design of the first wire 1031 and the third wire 1035, thereby reducing the area of the non-display area 101N and subsequently improving the screen-to-body ratio of the display panel and the display device, and implementing the narrow frame design.

It is to be noted that FIG. 6 only exemplarily shows that in the first direction X, a width of the first groove 10211 is greater than a width of the first wire 1031, a width of the second groove 10212 is greater than a width of the third wire 1035, the width of the first groove 10211 is equal to the width of the second groove 10212 and the width of the first wire 1031 is equal to the width of the third wire 1035. Meanwhile, the partial structure of the array substrate shown in FIG. 6 forms an axis symmetric pattern along the second direction Y. Such symmetric design is only for reducing the difficulty of designing and manufacturing process of the array substrate and is not intended to limit the array substrate 10 provided by the embodiment of the present disclosure. In other embodiments, the size of the first groove 10211, the second groove 10212, the second groove 10212, the first wire 1031, the third wire 1035, the first discharge tip 1032 and the third discharge tip 1036 may be configured according to the actual requirements of the array substrate 10, which is not limited in the embodiment of the present disclosure.

Figure 8:
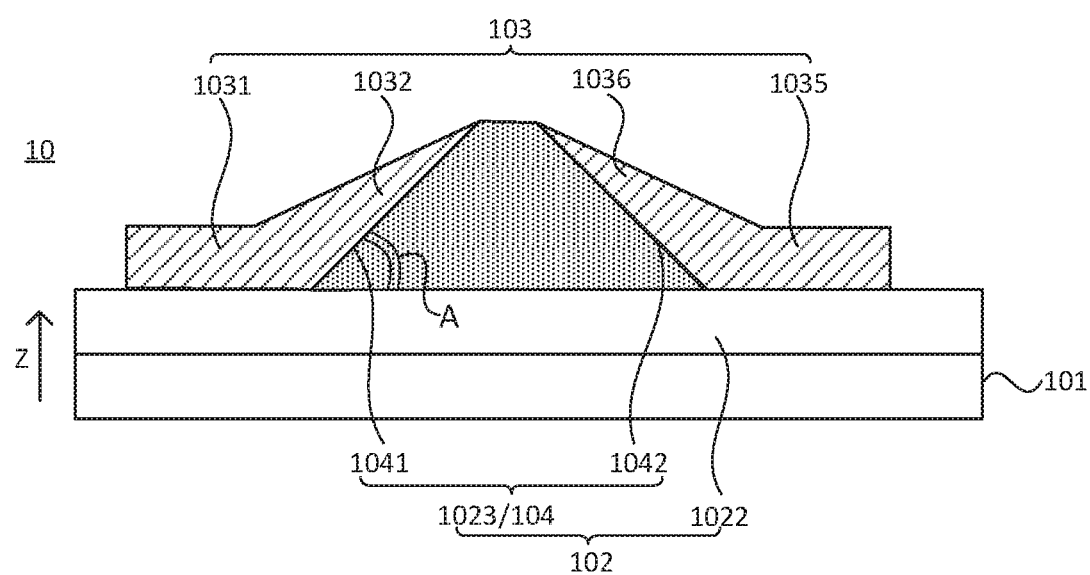
FIG. 8 is a cross-sectional structural diagram of another array substrate according to an embodiment of the present disclosure.

In an embodiment, FIG. 8 is a cross-sectional structural diagram of another array substrate according to an embodiment of the present disclosure. Referring to FIG. 8, the insulating layer 102 includes a second insulating layer 1022 and a third insulating layer 1023. The array substrate 10 may further include a thin film transistor. The second insulating layer 1022 and the third insulating layer 1023 each is at least one of a buffer layer, a gate insulating layer, an interlayer insulating layer, an interlayer medium layer, a passivation layer or a first planarization layer in the array substrate. The third insulating layer 1023 is located on a side of the second insulating layer 1022 away from the array substrate 101 and the third insulating layer 1023 includes a plateau-shaped protrusion 104.

When the array substrate 10 includes the thin film transistor, the film layer stack structure of the array substrate may be understood by referring to the above description and are not repeated herein.

In this structure, the insulating layer 102 includes the second insulating layer 1022 and the third insulating layer 1023. The second insulating layer 1022 may be a film layer with a flat surface. The plateau-shaped protrusion 104 is formed on the surface of the film layer with the flat surface by using the third insulating layer 1023, reducing the manufacturing difficulty of a single film layer. Meanwhile, the second insulating layer 1022 and the third insulating layer 1023 may be formed of different materials, so that the surface appearance of the second insulating layer 1022 may not be affected in the process of etching the third insulating layer 1023 to form the plateau-shaped protrusion 104. Therefore, the surface of the second insulating layer 1022 is still flat, which facilitates subsequent formation of the first wire 1031 and the third wire 1035 on the surface of the second insulating layer 1022. A contact interface of the first wire 1031 and the third wire 1035 with the second insulating layer 1022 is flat, thereby avoiding the unexpected discharge tips exist in the electrostatic discharge structure in addition to the first discharge tip 1032 and the third discharge tip 1036, thereby avoiding the occurrence uncontrolled discharge phenomena and further improving the controllability and long-term stability of the array substrate, display panel and display device.

Exemplarily, the second insulating layer 1022 may be a buffer layer, and the third insulating layer is a gate insulating layer; or the second insulating layer 1022 may be an interlayer insulating layer, and the third insulating layer is an interlayer medium layer. The combination of the second insulating layer 1022 and the third insulating layer 1023 may also be any optional combination of the above-mentioned insulating film layers, which is not limited in the embodiment of the present invention.

It is to be noted that FIG. 8, similar to FIG. 6, only exemplarily shows that the partial structure of the array substrate forms an axis symmetric pattern along the third direction Z. Such symmetric design is only for reducing the difficulty of designing and manufacturing process of the array substrate and is not intended to limit the array substrate 10 provided by the embodiment of the present disclosure. In other embodiments, the size of the plateau-shaped protrusion 104, the first wire 1031, the third wire 1035, the first discharge tip 1032 and the third discharge tip 1036 may be configured according to the actual requirements of the array substrate 10, which is not limited in the embodiment of the present disclosure.

Figure 9:
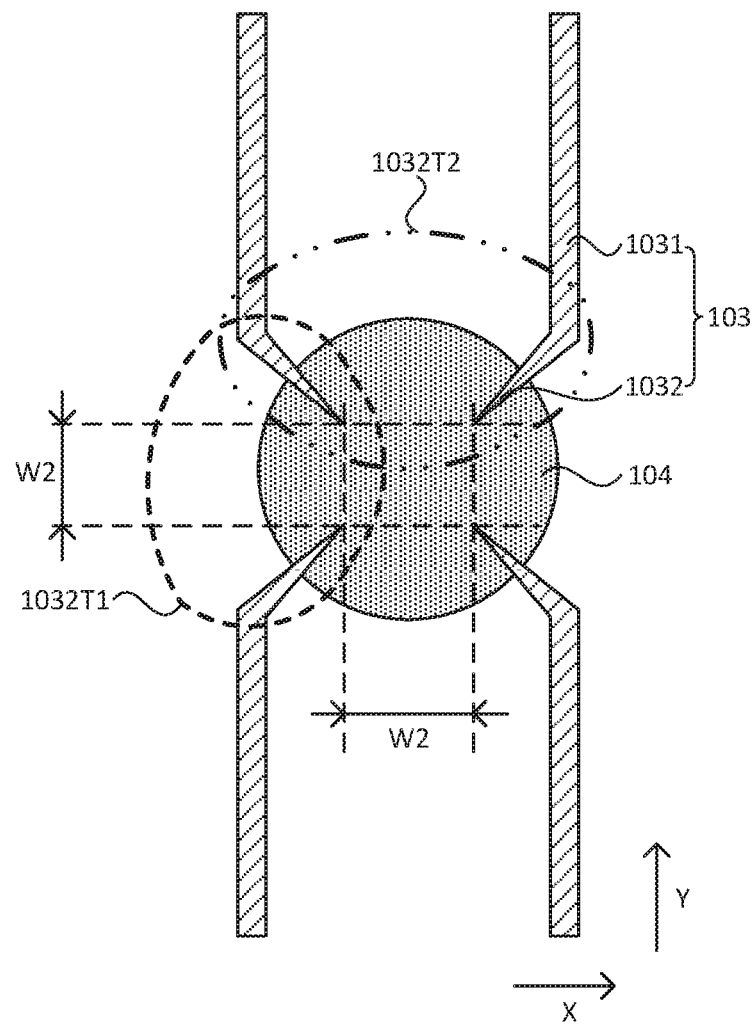
FIG. 9 is a partial enlarged structural diagram of another array substrate according to an embodiment of the present disclosure.

In an embodiment, FIG. 9 is a partial enlarged structural diagram of another array substrate according to an embodiment of the present disclosure. Referring to FIG. 9, the plateau-shaped protrusion 104 is a cylindrical plateau-shaped protrusion. A side slope of the cylindrical plateau-shaped protrusion is provided with multiple first discharge tips 1032 disposed opposite to each other.

Such configuration may increase the ways of releasing the electrostatic discharges and facilitate the release of the electrostatic discharges. Meanwhile, when one of the first wires 1031 and the first discharge tip 1032 electrically connected thereto are damaged, the remaining multiple first discharge tips 1032 can still implement the release of the electrostatic charges, thereby extending service life of the array substrate.

Exemplarily, the side slope of the plateau-shaped protrusion shown in FIG. 9 is provided with four first discharge tips 1032. On this basis, when one of the four first discharge tips 1032 is damaged, other three first discharge tips 1032 can still release electrostatic charges based on the point discharge.

It is to be noted that FIG. 9 only exemplarily shows that the number of the first discharge tips 1032 on the side slope of the same cylindrical plateau-shaped protrusion is four, but is not intended to limit the array substrate provided by the embodiment of the present disclosure. In other embodiments, the number of the first discharge tips 1032 located on the side slope of the same cylindrical plateau-shaped protrusion may be configured according to the actual requirements of the array substrate, exemplarily, may be three or eight, which is not limited in the embodiment of the present disclosure.

In an embodiment, referring to FIG. 9, multiple first discharge tips 1032 on the side slope of the same cylindrical plateau-shaped protrusion form multiple discharge tip pairs disposed opposite to each other (exemplarily, FIG. 9 only shows a first discharge tip pair 1032T1 and a second discharge tip pair 1032T2).

By such tip-to-tip configuration of two first discharge tips 1032 in the same discharge tip pairs, the discharge voltage of the point discharge may be reduced, so that when the amount of the electrostatic charges accumulated in the first discharge tip 1032 is small, the electrostatic charges may be conducted away by using the point discharge, thereby avoiding the line damages in the array substrate caused by the electrostatic charges released through other ways. In addition, multiple first wires 1031 electrically connected to the multiple first discharge tips 1032 located on the side slope of the same plateau-shaped protrusion are disposed in parallel, which facilities reducing the area occupied by the electrostatic discharge structure, thereby reducing the area of the non-display area 101N, and improving the screen-to-body ratio of the display panel and the display device and implementing its narrow frame design after subsequently forming the display panel and the display device.

In an embodiment, referring to FIG. 9, a distance W2 between the first discharge tips 1032 in each discharge tip pair is less than a second preset distance threshold.

The smaller the distance W2 between the two first discharge tips 1032 in discharge pairs is, the smaller the discharge voltage of the point discharge of the first discharge tip 1032 is. Exemplarily, the second preset distance threshold may be 1 μm, 0.8 μm or 0.5 μm, and the specific value of the second preset distance threshold may be configured according to the actual requirements of the array substrate 10, which is not limited in the embodiment of the present disclosure.

It is to be noted that to ensure the electrical insulation between the two first discharge tip 1032 in the discharge tip pairs, under the limitation of the process conditions at the current stage, the distance between the two first discharge tips 1032 cannot be infinitesimal, i.e., the distance between the two still needs to be greater than a lower limit. A specific value of the lower limit may be configured according to the actual requirements of the array substrate 10 and the actual limitation of the process conditions, and is not limited in the embodiment of the present disclosure.

In addition, it is to be noted that three distance values having similar meanings are defined in the above embodiments: the distance W0 between the first discharge 1032 and the second wire 134, which is less than the preset distance threshold in the first direction X in FIG. 4; the distance W1 between the first discharge 1032 and the third discharge 1036, which is less than the first preset distance threshold in FIG. 5; and the distance W2 between the first discharge tips 1032 in each discharge pair, which is less than the second preset distance threshold in FIG. 9. The specific values of the three distance values may be configured according to the actual requirements of the array substrate, the three may be the same or different, and is not limited in the embodiment of the present disclosure In an embodiment, the material of the electrostatic conductive layer 103 includes one of metal or transparent conducting oxide.

The metal material or transparent conducting oxide material may both be materials available for the film layer structure in the existing array substrate. Therefore, the electrostatic conductive layer 103 may be made of the same material with film layer structure in the existing array substrate and formed in the same process step. Therefore, new materials and new equipment may not be introduced and the manufacturing process of the array substrate may not be increased.

In an embodiment, referring to FIG. 5, the array substrate 10 may include a thin film transistor, a first electrode layer and a second electrode layer. The electrostatic conductive layer 103 is disposed on a same layer with a gate metal layer of the thin film transistor, a source drain metal layer of the thin film transistor, the first electrode layer or the second electrode layer. The display area 101A includes a pixel electrode layer and a common electrode layer, the first electrode layer is the pixel electrode layer, and the second electrode layer is the common electrode layer; or the display area 101A includes a light-emitting component, the first electrode layer is a cathode layer of the light-emitting component and the second electrode layer is an anode layer of the light-emitting component.

When the array substrate 10 includes the thin film transistor, the film layer stack structure of the array substrate may be understood by referring to the above description and are not repeated herein.

On the basis of the film layer structure of the array substrate 10, the film layer structure of the pixel unit is further included.

Exemplarily, if the array substrate 10 is applied to a light emitting diode display panel, then the array substrate 10 may further include an anode layer, a light emitting layer and a cathode layer which are stacked on one side of the planarization layer away from the substrate 101. Exemplarily, the material of the anode layer may be a metal, and the material of the cathode layer may be a transparent conducting oxide material (such as indium tin oxide). Therefore, in the film layer structure of the array substrate 10, the gate electrode layer (i.e., the gate metal layer), the source/drain electrode layer (i.e., the source/drain metal layer), the first electrode layer (which may be the anode layer) and the second electrode layer (which may be the cathode layer) each is a conductive film layer. The electrostatic conductive layer 103 may be disposed on a same layer with any one of the conductive film layers. Therefore, the number of film layers of the array substrate may not be increased and the overall thickness of the array substrate is not increased, which facilitates the slim design of the display panel and display device.

Exemplarily, if the array substrate 10 is applied to a liquid crystal display panel, then the array substrate 10 may further include the pixel electrode layer; or the array substrate 10 may further include the pixel electrode layer and the common electrode layer. According to different display modes of the liquid crystal display panel, the pixel electrode layer and the common electrode may be disposed in the same layer or different layer, which is not limited in the embodiment of the present disclosure and are not repeated herein. Therefore, in the film layer structure of the array substrate 10, the gate electrode layer (i.e., the gate metal layer), the source/drain electrode layer (i.e., the source/drain metal layer), the first electrode layer (which may be the pixel electrode layer) and the second electrode layer (which may be the common electrode layer) each is a conductive film layer. The electrostatic conductive layer 103 may be disposed on a same layer with any one of the conductive film layers. Therefore, the number of film layers of the array substrate may not be increased and the overall thickness of the array substrate is not increased, which facilitates the slim design of the display panel and display device.

It is to be noted that the above description only exemplarily shows that the array substrate is applied to the light emitting diode display panel and the liquid crystal display panel, but is not intended to limit the array substrate provided by the embodiment of the present disclosure. In other embodiments, the array substrate may also be applied to other types of display panels known to those skilled in the art, which is not limited in the embodiment of the present disclosure.

In an embodiment, referring to FIG. 8, an included angle A between the side slope (which may be the first side slope 1041 or the second side slope 1042) of the plateau-shaped protrusion 104 and a plane in which the substrate 101 is located has a value range of: $20° \leq A \leq 60°$.

Such configuration may have a moderate value range of the angle A (i.e., a slope angle of the side slope). Therefore, on the one hand, the slope angle may be prevented from being too small, so that at the same time of forming a relatively sharp discharge tip (which may include the first discharge tip 1032 and the third discharge tip 1036), the plateau-shaped protrusion 104 does not occupy too much non-display area, thereby facilitating the narrow frame design after subsequently forming of the display panel and display device. On the other hand, a gentle slope may avoid that a sharper discharge tip cannot be formed on the side slope when the slope angle is too large.

It is to be noted that the above only exemplarily shows a value range of the angle A is $20° \leq A \leq 60°$, but is not intended to limit the array substrate 10 provided by the embodiments of the present disclosure. In other embodiments, the value range of the angle A may be configured according to the actual requirements of the array substrate 10, such as $30° \leq A \leq 50°$ or $35° \leq A \leq 45°$, which is not limited in the embodiment of the present disclosure.

In an embodiment, referring to FIG. 5, the non-display area 101N includes a drive circuit arrangement area 101ND, and the electrostatic conductive layer 103 is disposed in the non-display area 101N and outside the drive circuit arrangement area 101ND.

The drive circuit arrangement area 101ND is used for placing an integrated circuit (IC) or for binding a flexible printed circuit (FPC). The circuit has high integration level and large space, and may integrate other electrostatic discharge structures.

It is to be noted that FIG. 5 only exemplarily shows that the drive circuit arrangement area 101ND is located below the display area 101A, which is only exemplarily description base on the orientation shown in FIG. 5, but is not to limit the display panel 10 according to the embodiments of the present disclosure. In other embodiments, a relative positional relationship between drive circuit arrangement area 101ND and the display area 101A may be configured according to the actual requirements of the array substrate 10, and is not limited in the embodiment of the present disclosure.

Based on the same inventive concept, a method for manufacturing an array substrate is further provided in an embodiment of the present disclosure, and may be used for forming any one of the array substrates provided by the above-mentioned embodiments, and therefore, also has the beneficial effects of the array substrates provided by the above-mentioned embodiments. Reference may be made to the above description for detailed understanding. Details are not described herein.

Figure 10:
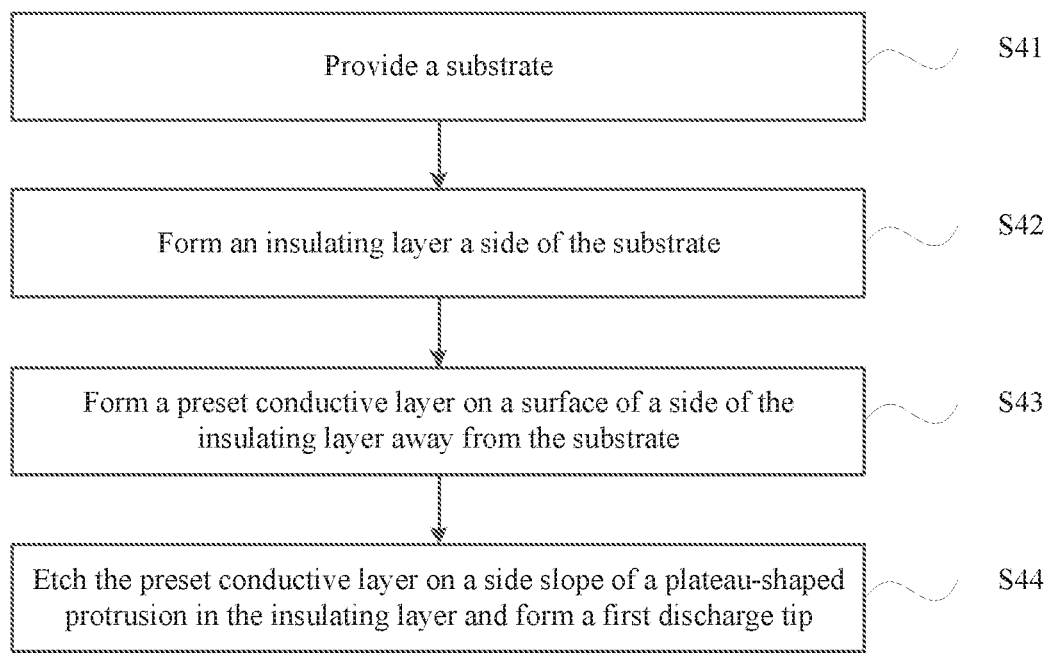
FIG. 10 is a flowchart illustrating a method for manufacturing an array substrate according to an embodiment of the present disclosure.

Exemplarily, FIG. 10 is a flowchart illustrating a method for manufacturing an array substrate according to an embodiment of the present disclosure. Referring to FIG. 10, the method for manufacturing the array substrate may include the steps described below.

In S41, a substrate is provided.

The substrate may be any one of the flexible substrate or the rigid substrate shown in the above description. The step may include that the substrate is cleaned, dried and transferred to a position of performing subsequent steps (such as a certain chamber in the device for manufacturing the array substrate).

In S42, an insulating layer is formed on a side of the substrate.

Exemplarily, referring to any one of FIGS. 3 to 8, the insulating layer 102 includes at least one plateau-shaped protrusion 104. A vertical projection (the vertical projection corresponds to a first length S1) of a surface of the plateau-shaped protrusion 104 away from the substrate 101 onto the substrate 101 is located within a vertical projection (the vertical projection corresponds to a second length S2) of a surface of the plateau-shaped protrusion 104 adjacent to the substrate 101 onto the substrate 101. Therefore, the side of the plateau-shaped protrusion 104 forms a side slope which prepares for forming a discharge tip subsequently.

In S43, a preset conductive layer is formed on a surface of a side of the insulating layer away from the substrate.

Exemplarily, the preset conductive layer may cover the side slope of the plateau-shaped protrusion 104 and the surface not forming the plateau-shaped protrusion in the insulating layer 102. The preset conductive layer is used for forming the discharge tip in the subsequent steps.

In S44, the preset conductive layer on the side slope of the plateau-shaped protrusion in the insulating layer is etched and a first discharge tip is formed.

At this point, the first discharge tip is formed on the side slope of the plateau-shaped protrusion, and the first discharge tip is relatively sharp, so that in the subsequent process steps, the process of forming the display panel and the use of the display device, the discharge voltage is relatively small, so that the electrostatic charges accumulated in the first discharge tip is easily to be released, and the problem of line damages of the array substrate caused by releasing the electrostatic charges through other ways can be avoided when the electrostatic charges is accumulated excessively and cannot be released by the point discharge.

It should be noted that the above steps S42, S43 and S44 may be performed synchronously in a certain step of the manufacturing process of the existing array substrate as long as the mask pattern of the mask plate is changed in the step. Therefore, new materials and new equipment may not be introduced and the manufacturing process of the array substrate may not be increased, thereby simplifying the manufacturing process of the array substrate.

On the basis of the above embodiments, an embodiment of the present disclosure further provides a display panel including the array substrate of the above embodiment of the present disclosure. Therefore, the display panel provided by the embodiment of the present disclosure also has the beneficial effects described in the above embodiments. Reference may be made to the above description for detailed understanding. Details are not described herein.

Figure 11:
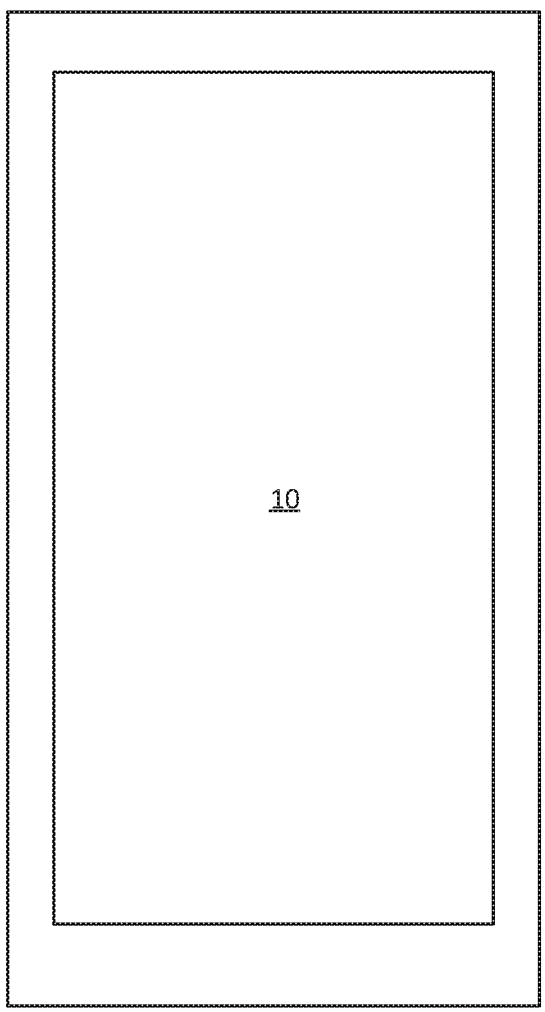
FIG. 11 is a structural diagram of a display panel according to an embodiment of the present disclosure.

Exemplarily, FIG. 11 is a structural diagram of a display panel according to an embodiment of the present disclosure. Referring to FIG. 11, the display panel 20 includes an array substrate 10.

Exemplarily, the display panel 20 provided by the embodiment of the present disclosure may be any product or component having a display function, such as a laptop, a tablet, a paper display, an electronic paper or a display. The display panel 20 may further include other components or film layer structures, which is not limited in the embodiment of the present disclosure.

Figure 12:
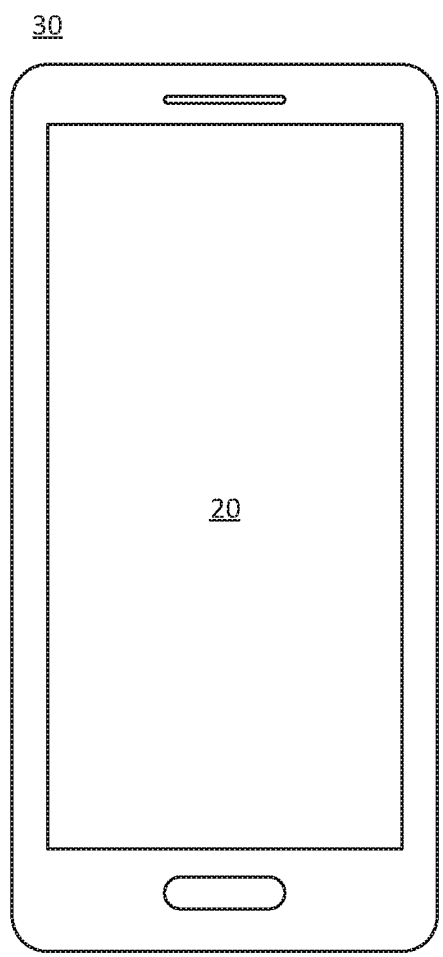
FIG. 12 is a structural diagram of a display device according to an embodiment of the present disclosure.

On the basis of the embodiments described above, the embodiment of the present disclosure further provides a display device. Exemplarily, FIG. 12 is a structural diagram of a display device according to an embodiment of the present disclosure. Referring to FIG. 12, the display device 30 includes a display panel 20 according to the embodiment described above.

The display device 30 provided by the embodiment of the present disclosure includes the display panel 20 in the above embodiments, and the display panel 20 includes the array substrate in the above embodiments, therefore, the display device 30 provided by the embodiment of the present disclosure also have the beneficial effects described in the above embodiments, and will not be repeated here again. Exemplarily, the display device 30 may be a mobile phone, a computer and a smart wearable device another other display devices known to those skilled in the art, which are not limited in the embodiment of the present disclosure.

It should be noted that the above are only preferred embodiments of the present disclosure and the technical principles used therein. It will be understood by those skilled in the art that the present disclosure is not limited to the embodiments described herein. Those skilled in the art can make various apparent modifications, adaptations, combinations and substitutions without departing from the scope of the present disclosure. Therefore, while the present disclosure has been described in detail via the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. An array substrate, comprising:
   a base substrate, which comprises a display area and a non-display area surrounding the display area;
   an insulating layer located on a side of the base substrate, wherein the insulating layer comprises at least one plateau-shaped protrusion, wherein the plateau-shaped protrusion includes a first surface and a second surface, wherein the first surface and the second surface are arranged opposite to each other along a direction perpendicular to the base substrate, the first surface is located at a side of the second surface opposite to the base substrate, and an area of the first surface is less than an area of the second surface in a direction perpendicular to the base substrate; and
   an electrostatic conductive layer located on a side of the insulating layer away from the base substrate, wherein the electrostatic conductive layer comprises a first wire and at least one first discharge tip, the first wire is electrically connected to the first discharge tip, the first discharge tip is located on a side slope of the plateau-shaped protrusion and is located in the non-display area;

wherein the electrostatic conductive layer further comprises an auxiliary discharge structure, the auxiliary discharge structure and the first discharge tip are disposed opposite to each other.

2. The array substrate of claim 1, wherein the electrostatic conductive layer further comprises a second wire located in the non-display area;
the second wire and the first wire are disposed in parallel, the first discharge tip and the second wire are disposed opposite to each other; and
the second wire forms the auxiliary discharge structure.

3. The array substrate of claim 1, wherein the plateau-shaped protrusion comprises a first side slope and a second side slope disposed opposite to each other, the electrostatic conductive layer further comprises a third wire and a third discharge tip, the third discharge tip is electrically connected to the third wire;
the first discharge tip is disposed on the first side slope, the third discharge tip is disposed on the second side slope,
the third wire and the first wire are disposed in parallel, the third discharge tip and the first discharge tip are disposed opposite to each other; and
the third wire and the third discharge tip form the auxiliary discharge structure.

4. The array substrate of claim 3, wherein a distance between the first discharge tip and the third discharge tip is greater than 0 and less than a first preset distance threshold, wherein the first preset distance threshold is a limit for release of electrostatic charges between the first discharge tip and the third discharge tip in a case where a voltage between the first discharge tip and the third discharge tip reaches a discharge voltage.

5. The array substrate of claim 1, wherein the insulating layer comprises a first insulating layer; the array substrate further comprises a thin film transistor; the first insulating layer is at least one of a buffer layer, a gate insulating layer, an interlayer insulating layer, an interlayer medium layer, a passivation layer or a planarization layer in the array substrate;
a first groove and a second groove disposed opposite to each other are formed on a surface of the first insulating layer away from the base substrate, a protrusion structure located between the first groove and the second groove is used for constituting the plateau-shaped protrusion.

6. The array substrate of claim 5, wherein the first groove and the second groove each is a bar-shaped groove.

7. The array substrate of claim 1, wherein the plateau-shaped protrusion is a cylindrical plateau-shaped protrusion;
a side slope of one cylindrical plateau-shaped protrusion is provided with a plurality of first discharge tips disposed opposite to each other.

8. The array substrate of claim 7, wherein the plurality of first discharge tips constitute a plurality of groups of discharge tip pairs, each discharge tip pair comprise two first discharge tips disposed opposite to each other.

9. The array substrate of claim 8, wherein a distance between the first discharge tips in each group of discharge tip pairs is greater than 0 and less than a second preset distance threshold, wherein the second preset distance threshold is a limit for release of electrostatic charges between the first discharge tips in a case where a voltage between the first discharge tips reaches a discharge voltage.

10. The array substrate of claim 1, wherein the insulating layer comprises a second insulating layer and a third insulating layer;
the array substrate further comprises a thin film transistor; the second insulating layer and the third insulating layer each is at least one of a buffer layer, a gate insulating layer, an interlayer insulating layer, an interlayer medium layer, a passivation layer or a planarization layer in the array substrate; and
the third insulating layer is located on a side of the second insulating layer away from the array substrate, the third insulating layer comprises the plateau-shaped protrusion.

11. The array substrate of claim 1, wherein the electrostatic conductive layer comprises one of metal or transparent conducting oxide.

12. The array substrate of claim 1, further comprising a thin film transistor, a first electrode layer and a second electrode layer;
the electrostatic conductive layer is disposed on a same layer with one of a gate metal layer of the thin film transistor, a source drain metal layer of the thin film transistor, the first electrode layer or the second electrode layer;
wherein the display area comprises liquid crystal layer, a pixel electrode layer and a common electrode layer, the first electrode layer is the pixel electrode layer, and the second electrode layer is the common electrode layer.

13. The array substrate of claim 1, further comprising a thin film transistor, a first electrode layer and a second electrode layer;
the electrostatic conductive layer is disposed on a same layer with one of a gate metal layer of the thin film transistor, a source drain metal layer of the thin film transistor, the first electrode layer or the second electrode layer;
wherein the display area comprises a light-emitting component, the first electrode layer is a cathode layer of the light-emitting component and the second electrode layer is an anode layer of the light-emitting component.

14. The array substrate of claim 1, wherein an inclined angle A between the side slope of the plateau-shaped protrusion and a plane in which the base substrate is located has a value range of: $20°≤A≤60°$.

15. The array substrate of claim 1, wherein the non-display area comprises a drive circuit area, the electrostatic conductive layer is disposed in the non-display area and outside the drive circuit area.

16. A display panel, comprising an array substrate, wherein the array substrate comprises:
a base substrate, which comprises a display area and a non-display area surrounding the display area;
an insulating layer located on a side of the base substrate, wherein the insulating layer comprises at least one plateau-shaped protrusion, wherein the plateau-shaped protrusion includes a first surface and a second surface, wherein the first surface and the second surface are arranged opposite to each other along a direction perpendicular to the base substrate, the first surface is located at a side of the second surface opposite to the base substrate, and an area of the first surface is less than an area of the second surface in a direction perpendicular to the base substrate; and
an electrostatic conductive layer located on a side of the insulating layer away from the base substrate, wherein the electrostatic conductive layer comprises a first wire and at least one first discharge tip, the first wire is electrically connected to the first discharge tip, the first discharge tip is located on a side slope of the plateau-shaped protrusion and is located in the non-display area;

wherein the electrostatic conductive layer further comprises an auxiliary discharge structure, the auxiliary discharge structure and the first discharge tip are disposed opposite to each other.

17. A display device, comprising a display panel, wherein the display panel comprises an array substrate, and the array substrate comprises:
- a base substrate, which comprises a display area and a non-display area surrounding the display area;
- an insulating layer located on a side of the base substrate, wherein the insulating layer comprises at least one plateau-shaped protrusion, wherein the plateau-shaped protrusion includes a first surface and a second surface, wherein the first surface and the second surface are arranged opposite to each other along a direction perpendicular to the base substrate, the first surface is located at a side of the second surface opposite to the base substrate, and an area of the first surface is less than an area of the second surface in a direction perpendicular to the base substrate; and
- an electrostatic conductive layer located on a side of the insulating layer away from the base substrate, wherein the electrostatic conductive layer comprises a first wire and at least one first discharge tip, the first wire is electrically connected to the first discharge tip, the first discharge tip is located on a side slope of the plateau-shaped protrusion and is located in the non-display area;

wherein the electrostatic conductive layer further comprises an auxiliary discharge structure, the auxiliary discharge structure and the first discharge tip are disposed opposite to each other.

* * * * *